United States Patent
Truong et al.

(10) Patent No.: US 7,737,728 B1
(45) Date of Patent: Jun. 15, 2010

(54) OCD DRIVER SLEW RATE CONTROL

(75) Inventors: Phat Truong, Houston, TX (US);
Pauline Mai, Houston, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/413,603

(22) Filed: Mar. 30, 2009

(51) Int. Cl.
*H03K 19/094* (2006.01)

(52) U.S. Cl. .......................................... 326/83; 326/87

(58) Field of Classification Search ............. 326/82–87; 327/108, 109
See application file for complete search history.

(56) References Cited

U.S. PATENT DOCUMENTS

2009/0002031 A1* 1/2009 Choi et al. .................... 326/87

* cited by examiner

*Primary Examiner*—Vibol Tan
*Assistant Examiner*—Thienvu V Tran
(74) *Attorney, Agent, or Firm*—Winston Hsu

(57) ABSTRACT

An off-chip driver (OCD) includes: a logic circuit, for providing a logic signal input; a pre-driver stage, coupled to the logic circuit, for providing a ramped up voltage in response to the logic signal input; a final driver stage, coupled to the pre-driver stage, for providing an output voltage in response to the ramped up voltage; and a bias circuit, coupled to the pre-driver stage, for providing a constant bias voltage to the pre-driver stage, wherein the constant bias voltage keeps the pre-driver stage within an operational range to compensate for variations in process, temperature and supply voltage.

9 Claims, 1 Drawing Sheet

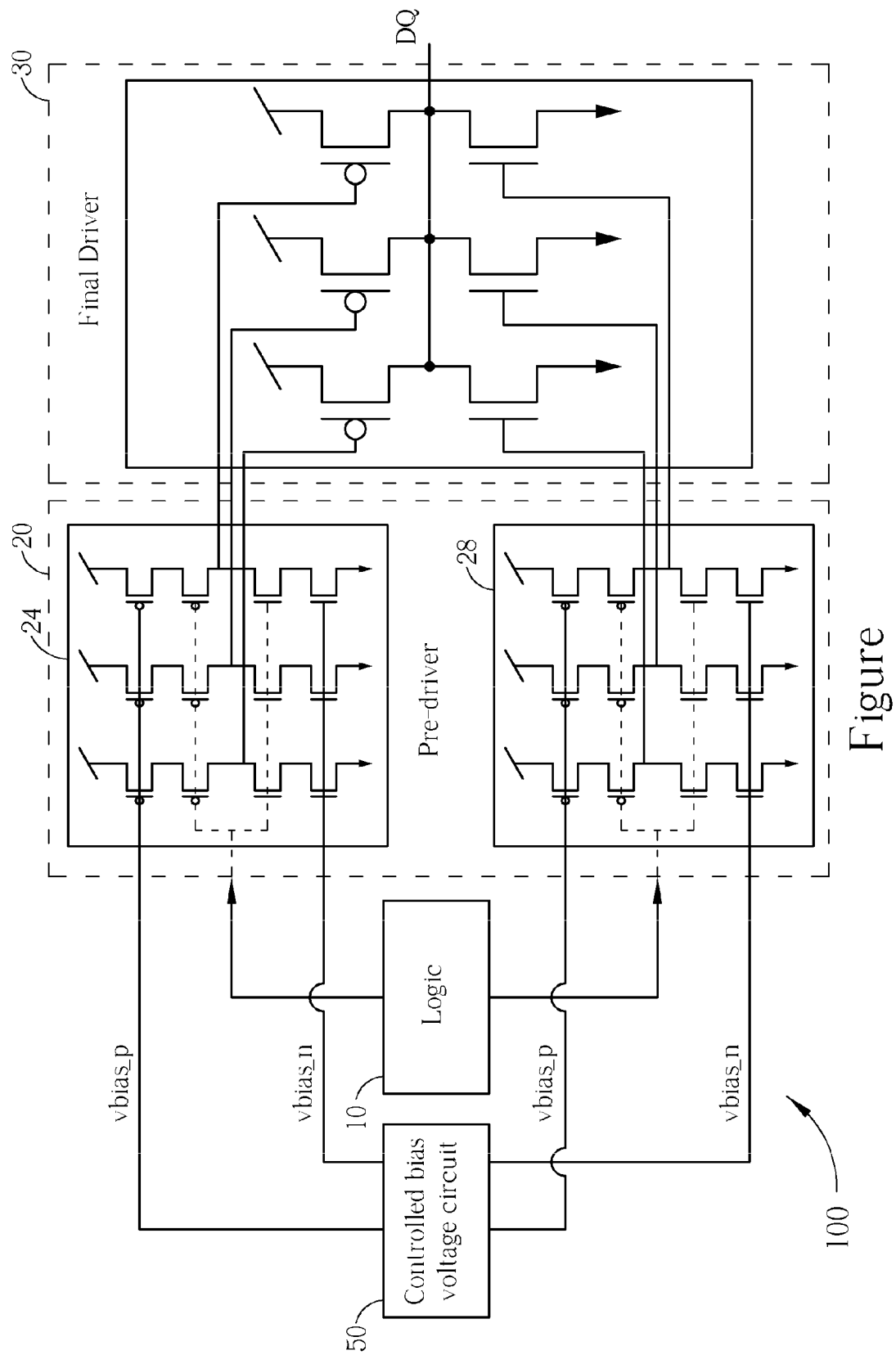
Figure

OCD DRIVER SLEW RATE CONTROL

BACKGROUND OF THE INVENTION

1. Field of the Invention

The present invention relates to off-chip drivers, and more particularly, to an off-chip driver that can compensate for variations in temperature, process, and supply voltage.

2. Description of the Prior Art

An off-chip driver is a well-known circuit in the field of electrical technology. A typical off-chip driver (OCD) consists of at least a pre-driver and a final driver, both controlled by a supply voltage. The purpose of the pre-driver is to control when and how the final driver stage is turned on or off. The turned-on and turned-off rates of the final driver then determine the slew rate of the output signal. Slew rate (change in voltage over time (V/ns)) of the output signal is an important indicator of the quality of the OCD. It is desirable that slew rate stays within a certain range across all conditions. Variations in process, temperature, or voltage supply (PVT) can cause slew rates to fluctuate. There are therefore various methods utilized to control slew rate.

There are three main methods used to control the slew rate of an OCD: time domain, constant current mirror, and constant voltage methods. The time domain method uses delay stages. The final driver is divided into a plurality of branches, each controlled by a separate pre-driver. Delay stages are built into each pre-driver in order to control the turned-on and turned-off rate of each branch of the final drivers, which helps to reduce the variation of slew rate. A second method uses current mirrors to put constant currents in the pre-drivers, so that the slew rate of the pre-drivers and subsequently the slew rate of the output signal have less variation. Another conventional method utilizes voltage regulators to ensure that a constant voltage can be provided to the gates of the pre-driver of the OCD, regardless of changes to the supply voltage.

The problem with the constant current and constant voltage methods is that these methods do not compensate for changes due to variations in supply voltage, temperature or process. In the time delay method, due to large variations in the delay at different process, voltage and temperature, the slew rate alters considerably with these variations. Therefore, a slew rate control method that can compensate for all PVT variations is required.

SUMMARY OF THE INVENTION

It is an aim of the present invention to provide an apparatus and method that can accurately control the slew rate of an OCD, even when there are PVT variations.

An off-chip driver (OCD) according to an exemplary embodiment of the present invention comprises: a logic circuit, for providing a logic signal input; a pre-driver stage, coupled to the logic circuit, for providing a voltage in response to the logic signal input; a final driver stage, coupled to the pre-driver stage, for providing an output voltage in response to the voltage from the pre-driver stage; and a bias circuit, coupled to the pre-driver stage, for providing a bias voltage to the pre-driver stage, wherein this bias voltage is designed to compensate for variations in process, temperature and supply voltage. The pre-driver and the driver stage are divided into a plurality of branches. Each branch in the pre-driver stage is associated with one branch in the driver stage.

A method for controlling slew rate of an off-chip driver (OCD), wherein the OCD includes a logic circuit, a pre-driver stage, and a final driver stage, comprises: utilizing the logic circuit to provide the pre-driver stage with a logic signal input; generating a voltage input to the final driver stage in response to the logic signal input; generating an output voltage in response to the voltage from the pre-driver; and providing a bias voltage to the pre-driver stage, wherein this bias voltage is designed to compensate for variations in process, temperature and supply voltage in order to minimize the variation of the slew rate of the OCD. The pre-driver and the driver stage are divided into a plurality of branches. Each branch in the pre-driver stage is associated with one branch in the driver stage. The ratio between a branch in pre-driver stage and its associated branch in the driver stage introduce a time delay in between every two branches of the driver. These time delays contribute in controlling the variation of the slew rate of the OCD.

These and other objectives of the present invention will no doubt become obvious to those of ordinary skill in the art after reading the following detailed description of the preferred embodiment that is illustrated in the various FIGURES and drawings.

BRIEF DESCRIPTION OF THE DRAWINGS

The FIGURE is a diagram showing an off-chip driver with bias voltage compensation.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

The present invention provides a method and apparatus where the slew rate of an off-chip driver can be controlled, even when there are process, voltage and temperature variations.

The concept of the present invention is to utilize bias voltages input to the pre-driver stage. The bias voltages are controlled by an external circuit to compensate for process, temperature and supply voltage variations. This ensures that the transistors of the driver stage are kept in a similar operational mode throughout the ranges of process, temperature and voltage supply. Also, choosing a different ratio between each branch of the pre-driver and its associated branch in the driver introduces a time delay in between every two branches of the driver. These time delays contribute in controlling the slew rate of the OCD across PVT.

Please refer to the FIGURE. The FIGURE is a diagram showing an off-chip driver 100 with the above-mentioned bias voltage compensation. The OCD 100 comprises a logic circuit 10, a pre-driver stage 20 including pre-drivers 24, 28, a final driver stage 30, and a controlled bias voltage circuit 50. As can be seen from the diagram, the OCD 100 also incorporates the time delay method, wherein the final driver 30 is divided into a plurality of branches, and each branch is controlled by a different pre-driver 24, 28. The bias voltages input to the pre-driver stage 20 ensure that the pre-drivers 24, 28 are kept within a certain operational range. When a first branch of the pre-drivers 24, 28 receives the logic signal from the logic circuit 10, the pre-drivers 24, 28 will be operational, and will work to drive the first final driver branch, once a voltage provided by the first pre-driver branch 24, 28 reaches a certain level. In the same way, subsequent branch of the pre-driver 20 become operational once the logic signal is received, and work to drive corresponding branch of the final driver 30.

As the pre-drivers 24, 28 are biased with the bias voltage, the VGS of the n-type and p-type channels of the pre-drivers are controlled; therefore, the turned-on and turned-off rate of the final drivers have minimum changes throughout process, temperature and supply voltage variations. Thus, slew rate of the OCD 100 can be controlled.

As can be seen from the diagram, the pre-driver 20 consists of a falling pre-driver 28 and a rising pre-driver 24, where both stages have an n-channel voltage vbias_n and a p-channel voltage vbias_p as inputs. It is noted that, although the FIGURE only shows two bias voltage inputs, providing extra bias voltages also falls within the scope of the present invention. Additionally, in the FIGURE the bias voltages are supplied from an external circuit 50, but any means of providing biased voltages to the pre-driver 20 also falls within the scope of the present invention.

To summarize, the present invention provides a method and apparatus for controlling slew rate, by providing bias voltages to the pre-drivers 24, 28 to compensate for variations in supply voltage, temperature and process. Biasing of the pre-driver stage 20 ensures that the VGS of the n-type and p-type channels of the pre-driver are controlled at different process, supply voltage and temperature; therefore, the turned-on and turned-off rate of the final drivers are under control. In addition, controlling the time delay in between every two branches of the driver stage also contributes to controlling the variation of the slew rate of the output signal across all PVT.

Those skilled in the art will readily observe that numerous modifications and alterations of the device and method may be made while retaining the teachings of the invention.

What is claimed is:

1. An off-chip driver (OCD) system having a controlled slew rate, comprising:
    an OCD, comprising:
        a logic circuit, for providing a logic signal input;
        a pre-driver stage, coupled to the logic circuit and divided into a plurality of branches, for providing a voltage in response to the logic signal input; and
        a final driver stage, coupled to the pre-driver stage and divided into a plurality of branches corresponding to the plurality of pre-driver branches, respectively, for providing an output voltage in response to the voltage from the pre-driver; and
    a bias circuit, coupled to the pre-driver stage, for providing bias voltages to the plurality of pre-driver branches, wherein the bias voltages keep the plurality of pre-driver branches within an operational range to compensate for variations in process, temperature and supply voltage.

2. The OCD system of claim 1, wherein the bias voltages, controlled by an external circuit, are input to the pre-driver stage to compensate for process, temperature and supply voltage variations.

3. The OCD of claim 1, wherein the bias voltage comprises a p-channel bias voltage and an n-channel bias voltage.

4. The OCD of claim 1, wherein a different ratio between each branch of the pre-driver stage and its associated branch in the driver stage introduces a time delay between every two branches of the driver stage.

5. The OCD of claim 1, wherein the bias circuit is external to the OCD.

6. A method for controlling slew rate of an off-chip driver (OCD), wherein the OCD includes a logic circuit, a pre-driver stage divided into a plurality of branches, and a final driver stage divided into a plurality of branches corresponding to the plurality of pre-driver branches, respectively, the method comprising:
    utilizing the logic circuit to provide the pre-driver stage with a logic signal input;
    generating a voltage input to the final driver stage in response to the logic signal input;
    generating an output voltage in response to the voltage from the pre-driver; and
    providing bias voltages to the plurality of pre-driver stage branches, wherein the bias voltages keep the pre-driver stage within an operational range to compensate for variations in process, temperature and supply voltage.

7. The method of claim 6, wherein the bias voltages, controlled by an external circuit, are input to the pre-driver stage to compensate for process, temperature and supply voltage variations.

8. The method of claim 6, wherein the bias voltage comprises a p-channel bias voltage and an n-channel bias voltage.

9. The method of claim 6, wherein a different ratio between each branch of the pre-driver stage and its associated branch in the driver stage introduces a time delay between every two branches of the driver stage that contributes to controlling the slew rate of the OCD across PVT.

* * * * *